United States Patent [19]

Liu et al.

[11] Patent Number: 4,517,674
[45] Date of Patent: May 14, 1985

[54] ZINC-DIFFUSED NARROW STRIPE ALGAAS/GAAS DOUBLE HETEROSTRUCTURE LASER

[75] Inventors: Yet-Zen Liu, Westlake Village; Chi-Shain Hong, Newbury Park; P. Daniel Dapkus, Anaheim, all of Calif.; James J. Coleman, Champaign, Ill.

[73] Assignee: The United States of America as represented by the Secretary of the Navy, Washington, D.C.

[21] Appl. No.: 413,596

[22] Filed: Aug. 31, 1982

[51] Int. Cl.³ .............................................. H01S 3/19
[52] U.S. Cl. ...................................... 372/45; 357/17; 372/46
[58] Field of Search ................ 372/44, 45, 46; 357/17

[56] References Cited

U.S. PATENT DOCUMENTS 4,105,955  8/1978  Hayashi et al. ...................... 372/45

OTHER PUBLICATIONS

C. S. Hong et al., "W-Shaped Diffused Stripe (WDS) GaAsGaAlAs Double Heterostructure Lasers Grown by Metal-Organic Chemical Vapor Depositon", Digest of Papers, Topical Meeting on Integrated and Guided--Wave Optics, Jan. 6-8, 1982.
C. S. Hong et al., "High-Efficiency, Low-Threshold, Zn-Diffused Narrow Stripe GaAs/GaAlAs Double Heterostructure Lasers Grown by Metalorganic Chemical Vapor Deposition", Appl. Phys. Lett, 40(3), Feb. 1 1982, pp. 208-210.
C. S. Hong et al., "Controlled Zn Diffusion for Low Threshold Narrow Strip GaAlAs/GaAs DH Lasers", IEEE Electron Device Letters, vol. EDL-2, No. 9, Sep. 1981, pp. 225-227.
M. Ueno et al., "Stable Transverse Mode Oscillation in Planar Stripe Laser with Deep Zn Diffusion", IEEE Journal of Quantum Electronics, vol. QE-15, No. 10, Oct. 1979, pp. 1189-1196.
H. Yonezu et al., "A GaAs-$Al_xGa_{l-x}$As Double Heterostructure Planar Stripe Laser", Japanese Journal of Applied Physcis, vol. 12, No. 10, Oct. 1973, pp. 1585, 1592.
H. Yonezu et al., "New Stripe Geometry Laser with High Quality Lasing Characteristics by Horizontal Transverse Mode Stabilization —A Refractive Index Guiding with Zn Doping", Japan J. Appl. Phys., vol. 16 (1977), No. 1, pp. 209-210.
K. Kobayashi et al., "Unstable Horizontal Transverse Modes and Their Stabilization with a New Stripe Structure", IEEE Journal of Quantum Electronics, vol. QE-13, No. 8, Aug. 1977, pp. 659-661.
H. Namizaki, "Transverse–Junstion–Stripe Lasers with A GaAs p-n Homojunction", IEEE Journal of Quantum Electronics, Jul. 1975, pp. 427-431.
H. Namizaki et al., "Transverse–Junction–Stripe-Geometry Double–Heterostructure Lasers with Very Low Threshold Current", Journal of Applied Physcis, vol. 45, No. 6, Jun. 1974, pp. 2785-2786.
T. Tsukada, "GaAs–$Ga_{l-x}Al_xAs$ Buried–Heterostructure Injection Lasers", J. of Applied Physics, vol. 45, No. 11, Nov. 1974, pp. 4899-4906.

Primary Examiner—James W. Davie
Attorney, Agent, or Firm—Robert F. Beers; William T. Ellis; John L. Forrest

[57] ABSTRACT

A zinc-diffused narrow stripe AlGaAs/GaAs double heterostructure laser device and a method of making the same. A double heterostructure layered structure including a p-type GaAs active layer sandwiched between two n-type AlGaAs confinement layers is formed on a substrate. A p-type zinc diffused stripe region having a U-shaped diffusion front extends longitudinally between two reflective surfaces located on respective ends of the device and extends vertically from the surface of the upper confinement layer down to at least the surface of intersection between the active layer and the lower confinement layer. In a method of forming the device, the various layers are formed by epitaxial growth or by metalorganic chemical vapor deposition. The stripe region is formed by diffusing zinc from a source through a slot in a diffusion mask. The zinc diffused into the device is driven in by heating the device in the absence of the zinc source.

14 Claims, 5 Drawing Figures

ZINC-DIFFUSED NARROW STRIPE ALGAAS/GAAS DOUBLE HETEROSTRUCTURE LASER

BACKGROUND OF THE INVENTION

The present Invention relates, in general, to a novel low lasing threshold deep diffused stripe semiconductor laser and, more particularly, to a novel low lasing threshold deep zinc-diffused narrow stripe AlGaAs/GaAs double-heterostructure laser.

Some of the characteristics of laser diodes that are important for fiber optic transmitter system applications include low cw laser threshold current, single mode operation, high differential quantum efficiency, small temperature dependence of laser threshold, and high output power. In addition, it is desirable that the growth of the structure and subsequent device processing be as simple as possible. Each of these desirable characteristics has been obtained separately in one or another of various laser structures which require specific control in growth or processing. However, no prior art device has combined all of these desirable characteristics in a single structure. The present Invention provides a novel solution to this problem.

In a stripe-geometry (Al,Ga)As double-heterostructure (DH) injection laser the electromagnetic field is guided along the active layer by spatial variations in both the gain and refractive index. In these devices the slightest asymmetry in the lateral dielectric constant profile can cause a shift in the lateral transverse mode toward the stripe edge where the gain is small or negative resulting in mode loss and undesirable non-linearities in the current verses light output curves. This problem can be partially avoided by reducing the stripe width to 10μm or less. Unfortunately, other problems exist with such structures.

Introducing built-in refractive index profiles along the active layer provides refractive index guiding and thus tends to stabilize the lateral transverse modes. For example, the buried heterostructure (BH) laser achieves this by embedding a GaAs active region in (Al,Ga)As while simultaneously producing a device having a low lasing threshold. The transverse junction stripe (TJS) laser having an active region in a GaAs p-n junction sandwiched between (Al,Ga)As layers additionally provides a refractive index profile across the junction in the active layer due to differences in conduction type and impurity concentration.

In both the buried heterostructure and the transverse junction stripe devices, the available active regions are less than a few microns which results in low maximum output power and severe structural design limitations. Also, the transverse junction stripe device exhibits an undesirably high lasing threshold.

Another device which produces stabilized lateral transverse mode lasing is a planar stripe laser device with a deep zinc diffusion called a deep zinc diffusion stripe (DDS) laser, as described by UENO and YONEZU, "Stable Transverse Mode Oscillations in Planar Stripe Laser With Deep Zn Diffusion", IEEE Journal of Quantum Electronics, Vol. QE-15, No. 10, October 1979. This device differs from other planar stripe devices primarily in the depth of the zinc diffusion front in relation to the active layer.

FIG. 1 illustrates a typical prior art deep diffusion stripe device in cross section. The device includes an n-type GaAs active layer located between two n-type AlGaAs confinement layers on an n+ GaAs substrate. Zinc is diffused into the device to form a "U" shaped diffusion front stripe region which reaches or passes through the GaAs active layer by a few tenths of microns. As a result of the stripe, the conduction type and carrier concentrations are different in the active stripe region and the portion of the n-type active layer outside the stripe region, thus producing a built-in refractive index step along the active layer. Lasing action takes place within the active stripe region with a relatively high lasing threshold.

The present Invention provides a novel laser diode device which is similar to the deep diffusion stripe device shown in FIG. 1 with the exception of an important difference: the use of a p-type active layer in place of the n-type active layer. The present Invention provides a device having all the desirable properties of the prior art deep diffusion stripe device and, in addition, exhibits a desirable low lasing threshold. Additionally, the position of the zinc stripe diffusion front is easier to control in the present Invention thereby allowing much higher processing yields.

SUMMARY OF THE INVENTION

Accordingly, one object of the present Invention is to provide a novel low-lasing threshold semiconductor laser device.

Another object is to provide a novel stripe-geometry semiconductor laser device.

Still another object is to provide a novel semiconductor laser device which may be made by a novel process which achieves high processing yields.

These and other objectives are achieved by the present Invention which provides a novel stripe-geometry semiconductor laser device which includes a semiconductor substrate of a first conductivity type having first and second surfaces. A first semiconductor confinement layer of the first conductivity type is formed on the first surface of the substrate. An active semiconductor layer of a second conductivity type having a band gap narrower than that of the first confinement layer is formed on the first confinement layer forming a heterojunction therebetween followed by a second confinement layer of the first conductivity type which forms a heterojunction with the active layer. The second confinement layer has a band gap wider than that of the active layer. An elongated stripe region doped with an impurity of the second conductivity type is located in portions of the second confinement layer and the active layer. The stripe region extends between two reflective surfaces located on respective ends of the device. Electrode means are coupled to the second surface of the substrate and to a first surface of the second confinement layer. Laser oscillation takes place in the portion of the stripe region located in the active layer and the resultant laser radiation produced is guided by that portion of the stripe region.

These and other objectives are achieved by a novel method of forming a stripe-geometry laser device which includes the steps of providing an n-type GaAs substrate, forming an n-type $Al_xGa_{1-x}As$ first confinement layer on a major surface of the substrate, forming a p-type GaAs active layer on the first confinement layer, and forming an n-type $Al_xGa_{1-x}As$ second confinement layer on the active layer. A diffusion mask is formed on a portion of the surface of the second confinement layer. The mask is etched to form an elongated stripe therein. A p-type impurity is diffused through the etched stripe in the mask to form a p-type stripe region in the device which extends from the surface of the second confinement layer to at least the intersecting surface between the active layer and the first confinement layer. The stripe region has a U-shaped diffusion front. Finally, contact electrodes are formed on another surface of the substrate and on the surface of the second confinement layer.

BRIEF DESCRIPTION OF THE DRAWINGS

A more complete appreciation of the Invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
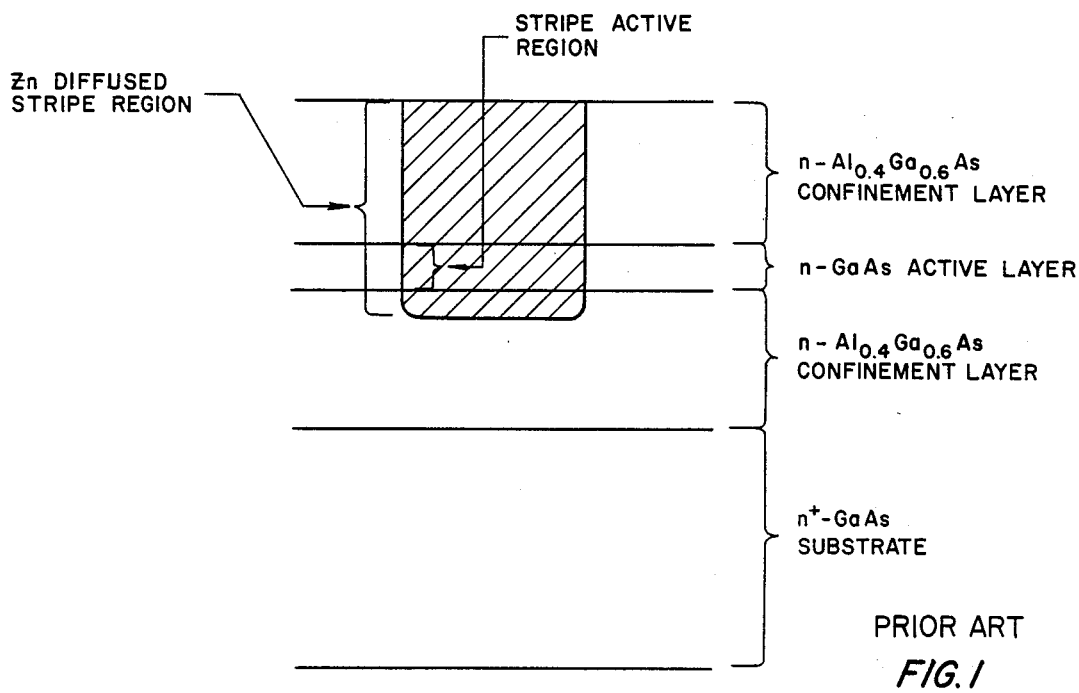
FIG. 1 illustrates, in cross-section, a prior art deep zinc diffusion stripe semiconductor laser.
Figure 2:
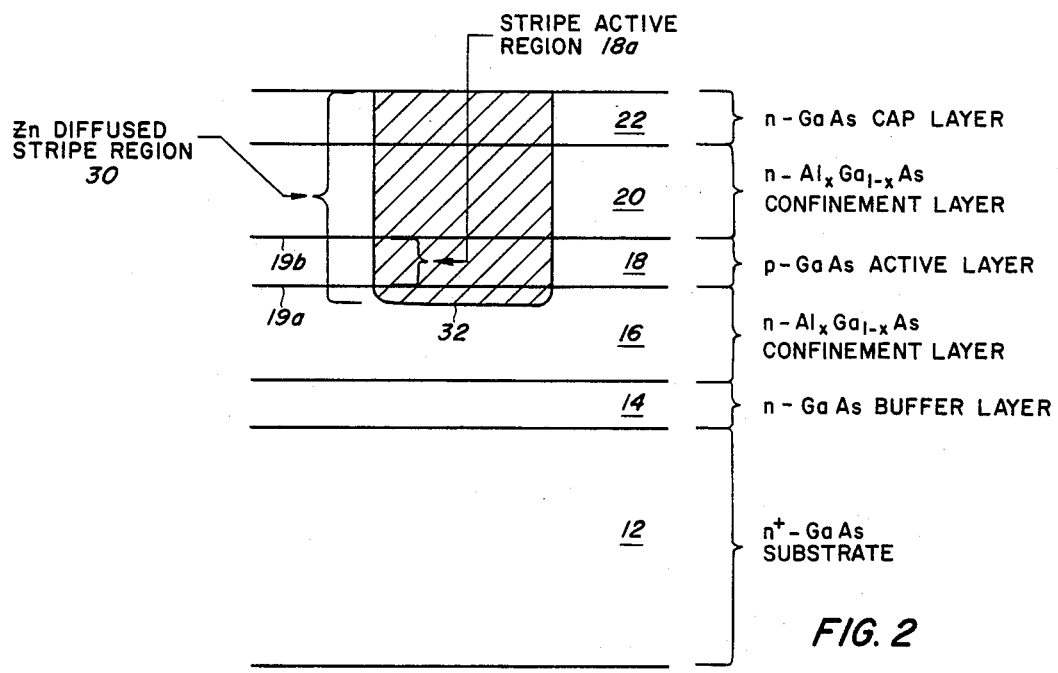
FIG. 2 illustrates, in cross-section, a first preferred embodiment of a semiconductor laser device according to the present Invention.

Referring now to the drawings, wherein like reference numerals designate identical or corresponding parts throughout the several views, and more particularly to FIG. 2 thereof, a cross-section of a semiconductor laser device 10 according to a first preferred embodiment of the present Invention is illustrated as including an n-type GaAs buffer layer 14 formed on an $n^{30}$ GaAs substrate 12. The buffer layer 14 provides a relatively defect-free clean surface upon which the remainder of the device 10 is formed. As should be apparent to persons of skill in the art, the buffer layer 12 may be eliminated if the upper surface of the substrate 12 is sufficently clean to support the growth of additional device layers.

The laser device 10 further includes an n-type $Al_xGa_{1-x}As$ lower confinement layer 16, a p-type GaAs active layer 18, and an n-type $Al_xGa_{1-x}As$ upper confinement layer 20 all formed on the buffer layer 14 (or the substrate 12, if possible) as shown. The lower confinement layer 16 and the upper confinement layer 20 form first and second heterojunctions 19a and 19b, respectively, with the active layer 18. The band gaps of both the lower confinement layer 16 and the upper confinement layer 20 are each wider than the band gap of the active layer 18. An n-type GaAs cap layer 22 covers the upper surface of the upper confinement layer 20 and is used for making contact to the various portions of the device 10 as is well-known in the art. The method of forming the various layers and the various doping levels of the layers will be disclosed below.

A zinc diffused stripe region 30 extends through the cap layer 22, the upper confinement layer 20, and the active layer 18. The diffusion front 32 of the stripe region 30 has a "U" shape, the lower edge of which may reach the upper surface of the lower confinement layer 16 or may actually be located within the lower confinement layer 16. The n-p-n structure formed by the layers 16, 18, and 20 outside the stripe region 30 automatically forms a reverse-biased junction. Lasing takes place within the stripe active region 18a. Although not illustrated, it should be understood that the stripe region 30 extends between two reflective surfaces located on respective ends of the device which provide feedback for the laser oscillation.

The method of forming the laser device 10 of FIG. 2 will now be discussed. The layered structure was consecutively grown an a major surface of a (100) oriented silicon-doped GaAs substrate 12 by metalorganic chemical vapor deposition at a temperature of 750° C. The following layers were sequentially grown: a 0.75 $\mu$m n-type selenium doped ($2 \times 10^{18}/cm^3$) GaAs buffer layer 14, a 2 $\mu$m n-type selenium doped ($7 \times 10^{17}/cm^3$) $Al_{0.4}Ga_{0.6}As$ lower confinement layer 16, a 0.3 $\mu$m zinc doped ($8 \times 10^{17}/cm^3$) p-type GaAs active layer 18, an approximately 2 $\mu$m n-type selenium doped ($1 \times 10^{17}/cm^3$) $Al_{0.4}Ga_{0.6}As$ upper confinement layer 20, and a 0.1 $\mu$m n-type selenium doped ($2 \times 10^{18}/cm^3$) GaAs cap layer 22. Alternatively, the layered structure may be formed using liquid phase epitaxy at a temperature of 780° C. In this case, the n-type layers should be doped with tin and the p-type action layer should be doped with germanium.

After the layered structure was formed, a plasma enhanced chemical vapor deposition $Si_3N_4$ film (not shown) was deposited on the cap layer 22 to serve as a diffusion mask. Next, a plurality of 4 $\mu$m-wide stripes, which were aligned parallel to a cleaved edge, were etched in the $Si_3N_4$ diffusion mask. Zinc was then diffused into the device 10 through the stripes in the diffusion mask using a two step diffusion process as follows.

The device was first sealed in a quartz ampul with a $ZnAs_2$ source. Diffusion was carried out at 650° C. for 20 minutes and quenched off to introduce zinc into the sample. At 650° C., the diffusion rates in n-type GaAs and n-type $Al_{0.4}Ga_{0.6}As$ were determined to be 1.4 $\mu$m/hr.$^{\frac{1}{2}}$ and 2.0 $\mu$m/hr.$^{\frac{1}{2}}$, respectively. The first diffusion produced a very abrupt junction having a surface concentration of approximately $10^{20}/cm^3$. This layer of zinc then served as a source for a second drive-in diffusion step in the absence of the $ZnAs_2$ source. The second diffusion was carried out at 820° C. for two hours in an arsenic-rich atmosphere.

Upon examination of a sample, two diffusion fronts were observed indicating a "shoulder" in the diffusion profile resulting from the two-step process. A self-limiting effect exists in driving the diffusion front from a AlGaAs layer to an adjacent GaAs layer due to the slower moving rate in GaAs and the finite diffusion source. The movement of the diffusion front thus deviates little from the square root of time dependance during the second drive-in diffusion. Thus, the final diffusion front can be readily controlled to reach or slightly pass through the GaAs active layer 18 during the second diffusion. The diffusion front was observed to have a tangential width of approximately 4 $\mu$m.

After the diffusion was completed, the $Si_3N_4$ diffusion mask was completely removed. Ohmic contacts (not shown) of Au-Ge/Ni/Au (alloyed) and Cr/Au were formed on the upper and lower surfaces of the device 10, respectively, in a well-known manner and individual diodes were defined by cleaving. The finished devices were then bonded to a heat sink with indium solder for subsequent testing.

Figure 3:
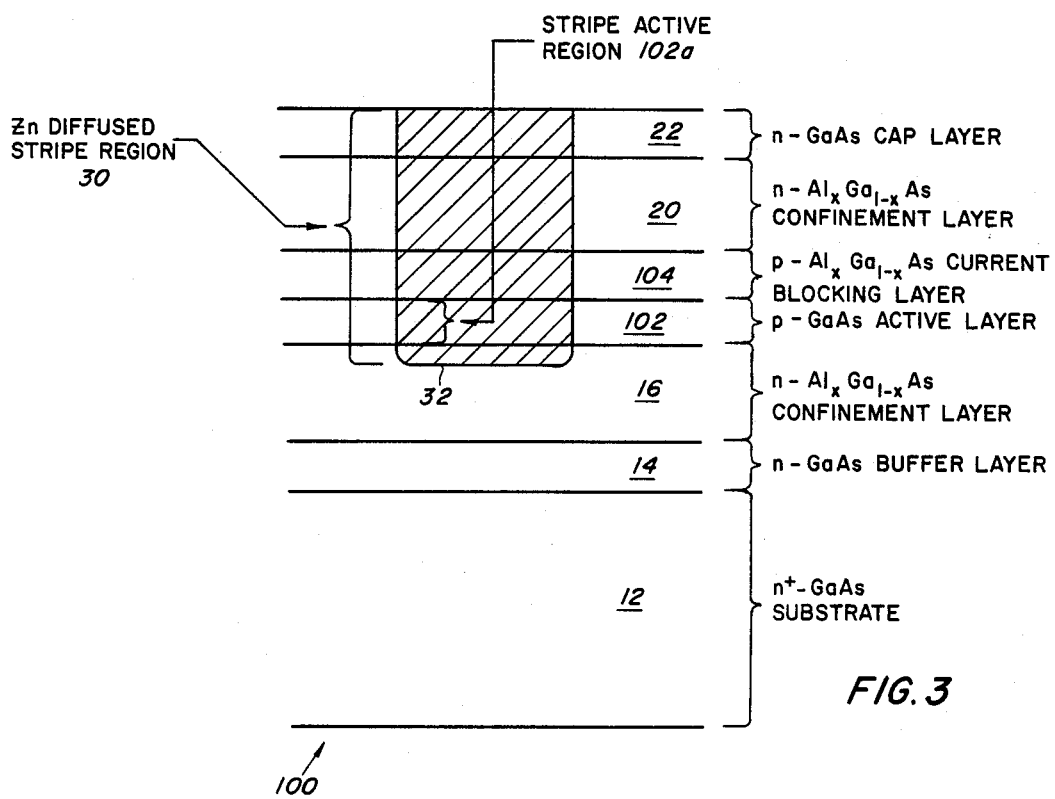
FIG. 3 illustrates, in cross-section, a second preferred embodiment of a semiconductor laser device according to the present Invention.

FIG. 3 illustrates a cross-section of a semiconductor laser device 100 according to a second preferred embodiment of the present Invention. Portions of the device 100 which correspond to the device 10 shown in FIG. 2 are identically numbered.

In the device 100, an approximately 750 Å zinc-doped ($1 \times 10^{18}/cm^3$) p-type active layer 102 is formed on the lower confinement layer 16. A 0.1 to 0.3 μm zinc-doped ($1 \times 10^{18}/cm^3$) p-type $Al_{0.4}Ga_{0.6}As$ current blocking layer 104 is formed on the active layer 102. The remainder of the structure of the device 100 is identical to that of the device 10 shown in FIG. 2. The active layer 102 and the current blocking layer 104 are both formed by metalorganic chemical vapor deposition during the formation of the layered device as described above. Alternatively, these layers may be formed during the formation of the layered device using liquid phase epitaxy, as described above, in which case germanium would be used as the dopant in place of zinc. The zinc diffused stripe region was formed as described above.

The current blocking layer 104 in combination with the active layer 102 allows separate optimization of the functions of each of these layers. In general in the absence of a current blocking layer, a reduction in the thickness of an active layer results in a corresponding reduction in the lasing threshold down to a thickness which is too small for effective light confinement and for effective current blocking. Thus reduction of the active layer thickness to less than 0.1 μm in the absence of a current blocking layer results in an effective increase in the lasing threshold. With the addition of the current blocking layer, the thickness of the active layer may be reduced to optimize the lasing threshold. Additionally, the current blocking layer 104 may supply an additional light guiding layer within the device if the aluminum content of the current blocking layer is less than that of the adjacent upper confinement layer 20. For example, if the upper confinement layer 20 is formed of $Al_xGa_{1-x}As$ and the current blocking layer is formed of $Al_yGa_{1-y}As$, light guiding will occur in the current blocking layer when $X > Y$.

Figure 4:
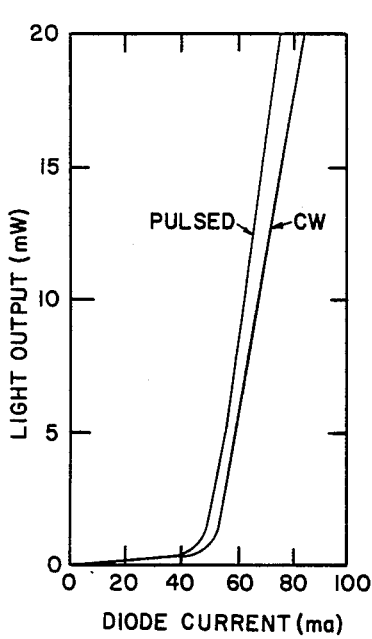
FIG. 4 illustrates light output versus current curves for the device shown in FIG. 3.

FIG. 4 illustrates typical curves for output power per facet versus imput current for a 220 μm cavity length device as shown in FIG. 3 for both pulsed (1 μsec, 1 KHz) and cw operation. The observed cw threshold of 50 mA is about 10% higher than the pulsed value and is comparable to similar devices (for a given diode length) with n-type active layers. Low threshold currents ($I_{th}$) are obtained because the lateral current leakage to the upper n-type AlGaAs confinement layer 20 is automatically minimized by the presence of the isolating p-type current blocking layer 104 in the structure.

Figure 5:
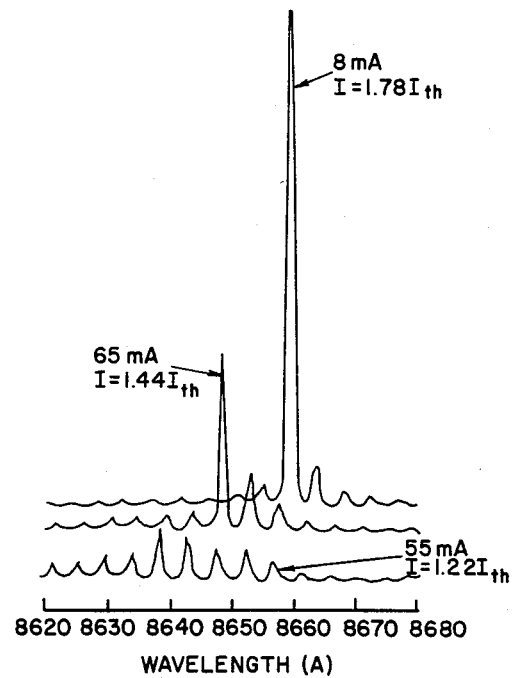
FIG. 5 illustrates the emission spectra at various current levels for the device shown in FIG. 3.

Representative emission spectra at various current levels are shown in FIG. 5 for pulsed operation. Single longitudinal mode laser operation is observed at $I \gtrsim 1.4\ I_{th}$. The lasing wavelength is approximately 8650 Å and shifts to the longer wavelengths when the pumping current is increased.

One important feature of the laser devices according to the present Invention is their extremely high quantum efficiency. The measured external differential quantum efficiency is about 40–45% per facet as compared to the 20–30% efficiency for normal double heterostructure lasers and 30–40% for buried heterostructure lasers.

Obviously, numerous (additional) modifications and variations of the present Invention are possible in light of the above teachings. It is therefore to be understood that within the scope of the appended claims, the Invention may be practiced otherwise than as specifically described herein.

What is claimed as new and desired to be secured by Letters Patent of the United States is:

1. A stripe-geometry semiconductor laser device comprising:
   a semiconductor substrate of a first conductivity type having first and second surfaces;
   a first semiconductor confinement layer formed on said first surface of said substrate, said first confinement layer being of said first conductivity type;
   an active semiconductor layer formed on said first confinement layer, said active layer being of a second conductivity type and having a band gap narrower than that of said first confinement layer, said active layer and said first confinement layer forming a heterojunction therebetween;
   a current blocking layer of a second conductivity type formed on said active layer, said current blocking layer having a band gap wider than that of said active layer, said current blocking layer and said active layer forming a heterojunction therebetween said stripe region passing through a portion of said current blocking layer;
   a second semiconductor confinement layer formed on said current blocking layer, said second confinement layer being of said first conductivity type and having a band gap wider than that of said active layer;
   an elongated stripe region located in a portion of said second confinement layer and in a portion of said active layer, said stripe region longitudinally extending between two reflective surfaces located on respective ends of said device, said stripe region being doped with an impurity of said second conductivity type; and
   electrode means coupled to said second surface of said substrate and to a first surface of said second confinement layer;
   wherein laser oscillation takes place in said portion of said stripe region located in said active layer, the resultant laser radiation being guided by said portion of said stripe region located in said active layer.

2. The stripe-geometry semiconductor laser device as recited in claim 1, which further comprises:
   a buffer layer of said first conductivity type located between said substrate and said first confinement layer; and
   a cap layer of said first conductivity type, located between said second confinement layer and said electrode means, said stripe region passing through a portion of said cap layer.

3. The stripe-geometry semiconductor laser device as recited in claim 1, wherein:
   said stripe region passes through a portion of said first confinement layer.

4. The stripe-geometry semiconductor laser device as recited by claims 1, or 3, wherein:
   said stripe region has a U-shaped cross-section taken in a plane perpendicular to the planes of intersection of the various layers making up said device.

5. The stripe-geometry semiconductor laser device as recited in claims 1, or 3, wherein:
   said first conductivity type is n-type; and
   said second conductivity type is p-type.

6. The stripe-geometry semiconductor laser device as recited in claim 2, wherein:
   said first conductivity type is n-type; and
   said second conductivity type is p-type.

7. The stripe-geometry semiconductor laser device as recited in claims 1, or 3, wherein:
   said substrate comprises GaAs;
   said first confinement layer comprises $Al_xGa_{1-x}As$, where $0<x<1$;
   said active layer comprises GaAs; and
   said second confinement layer comprises $Al_xGa_{1-x}As$, where $0<x<1$.

8. The stripe-geometry semiconductor laser device as recited in claim 7, wherein:
   said quantity x is equal to 0.4 and said quantity $(1-x)$ is equal to 0.6.

9. The stripe-geometry semiconductor laser device as recited in claim 1, wherein:
   said current blocking layer is formed of $Al_xGa_{1-x}As$, where $0<x<1$.

10. The stripe-geometry semiconductor laser device as recited in claim 9, wherein:
    said quantity x is equal to 0.4 and said quantity $(1-x)$ is equal to 0.6.

11. The stripe-geometry semiconductor laser device as recited in claim 2, wherein:
    said substrate comprises GaAs;
    said buffer layer comprises $Al_xGa_{1-x}As$, where $0<x<1$;
    said first confinement layer comprises $Al_xGa_{1-x}As$, where $0<x<1$;
    said active layer comprises GaAs;
    said second confinement layer comprises $Al_xGa_{1-x}As$, where $0<x<1$; and
    said cap layer comprises GaAs.

12. The stripe-geometry semiconductor laser device as recited in claim 11, wherein:
    said quantity x is equal to 0.4 and said quantity $(1-x)$ is equal to 0.6.

13. The stripe-geometry semiconductor laser device as recited in claim 1, or 3 wherein:
    said stripe region is doped with zinc.

14. The stripe-geometry semiconductor laser device as recited in claim 2, wherein:
    said stripe region is doped with zinc.

* * * * *